(12) United States Patent
Umeda

(10) Patent No.: US 6,995,092 B2
(45) Date of Patent: Feb. 7, 2006

(54) METHOD FOR MANUFACTURING AN ELECTRONIC DEVICE

(75) Inventor: Kazuo Umeda, Toyama (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 190 days.

(21) Appl. No.: 10/261,504

(22) Filed: Oct. 2, 2002

(65) Prior Publication Data

US 2003/0064604 A1 Apr. 3, 2003

(30) Foreign Application Priority Data

Oct. 3, 2001 (JP) .............................. 2001-307151

(51) Int. Cl.
*H01L 21/302* (2006.01)
*H01L 21/3065* (2006.01)

(52) U.S. Cl. ...................... 438/706; 438/707; 438/745; 134/1; 134/1.3

(58) Field of Classification Search ................ 438/706, 438/745, 704, 707; 134/1.2, 1, 1.3
See application file for complete search history.

(56) References Cited

U.S. PATENT DOCUMENTS

| 5,146,299 | A | * | 9/1992 | Lampe et al. ................ 257/295 |
| 5,403,434 | A | * | 4/1995 | Moslehi ....................... 134/1.2 |
| 5,519,802 | A | * | 5/1996 | Field et al. .................. 385/129 |
| 5,615,041 | A | * | 3/1997 | Field et al. .................. 359/326 |
| 6,340,621 | B1 | * | 1/2002 | Anderson et al. ............ 438/396 |
| 6,391,119 | B1 | * | 5/2002 | Lee et al. ....................... 134/3 |
| 6,457,479 | B1 | * | 10/2002 | Zhuang et al. ................ 134/1.3 |
| 6,699,726 | B2 | | 3/2004 | Hidaka et al. .................. 438/3 |

FOREIGN PATENT DOCUMENTS

| JP | 01077027 A | * | 3/1989 |
| JP | 5-47732 | | 2/1993 |
| JP | 10-12844 | | 1/1998 |
| JP | 10-144876 | | 5/1998 |
| JP | 11-17124 | | 1/1999 |
| JP | 11-317500 | | 11/1999 |
| JP | 2000-150442 | | 5/2000 |
| JP | 2000-262999 | | 9/2000 |
| JP | 2001-15472 | | 1/2001 |

OTHER PUBLICATIONS

Hitoshi, Manufacture of Electrode Terminal of Active Device, Mar. 23, 1989, English Abstract of JP 01077027 A), 1 page.*

* cited by examiner

*Primary Examiner*—Nadine G. Norton
*Assistant Examiner*—Lynette T. Umez-Eronini
(74) *Attorney, Agent, or Firm*—McDermott Will & Emery LLP

(57) ABSTRACT

When an electronic device having an element including an insulating metal oxide film is manufactured, either dry cleaning or a cleaning solution containing substantially no water is used in a cleaning step conducted after a step of forming the insulating metal oxide film.

16 Claims, 9 Drawing Sheets

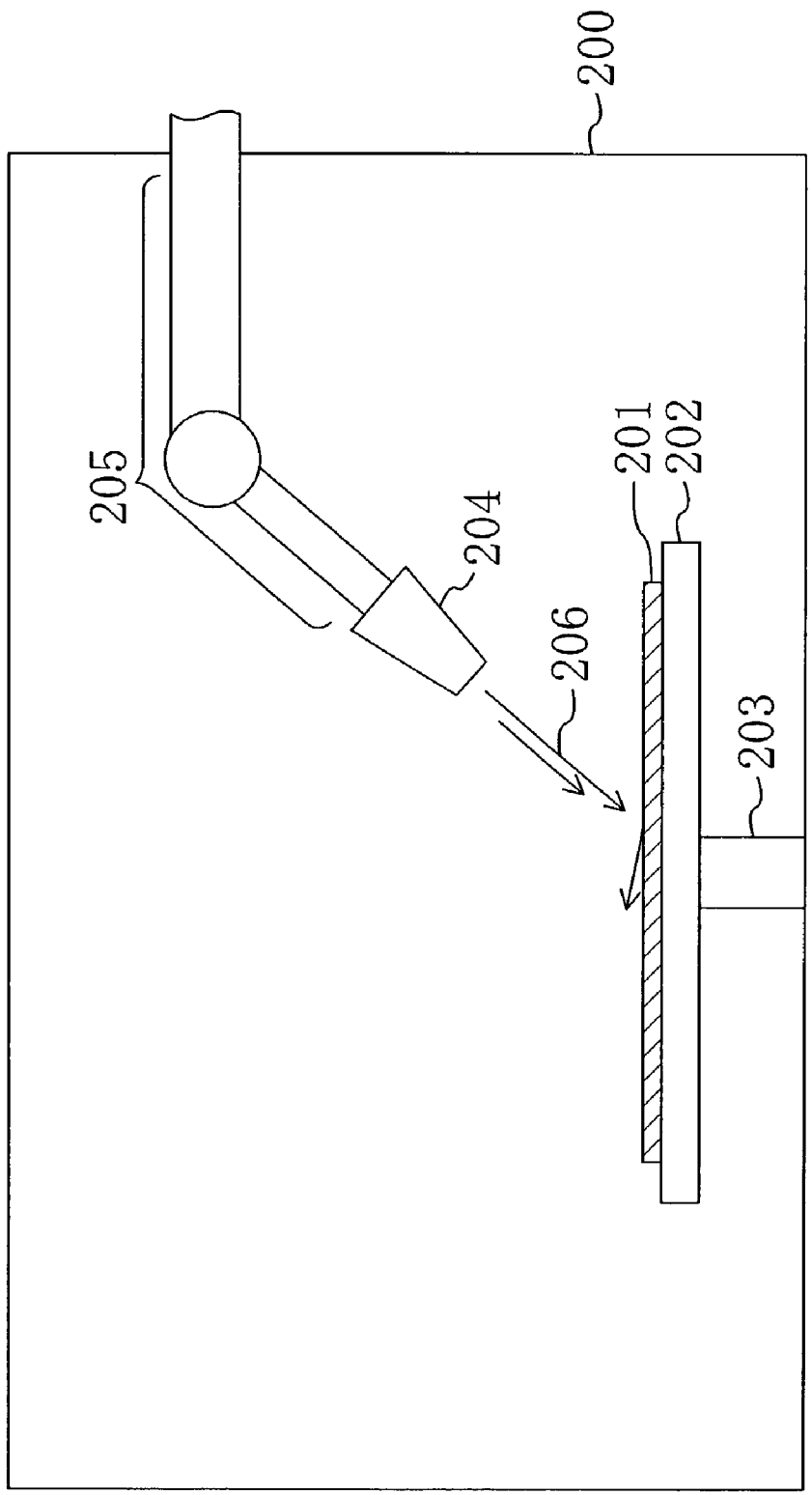

METHOD FOR MANUFACTURING AN ELECTRONIC DEVICE

BACKGROUND OF THE INVENTION

The present invention relates to a method for manufacturing an electronic device having an element including a ferroelectric film or a high dielectric constant film (hereinafter, referred to as high-k film).

Recently, non-volatile or high-capacity semiconductor memory elements having a thin film formed from an insulating metal oxide (such as a ferroelectric material or a high dielectric constant material (a dielectric material having a high dielectric constant; hereinafter, referred to as high-k material)), especially, a substance having a perovskite crystal structure, are increasingly developed. The use of hysteresis characteristics of a ferroelectric film enables implementation of a non-volatile memory. Moreover, the use of a high-k film having a much greater dielectric constant than a silicon oxide film as a capacitor insulating film enables reduction in memory cell area, and thus enables implementation of a highly-integrated high-capacity RAM (Random Access Memory). Typical materials which are actively studied for application to such a memory include lead zirconate titanate ($Pb(ZrTi)O_3$; PZT), barium strontium titanate (($Ba, Sr)TiO_3$; BST), niobium strontium bismuth tantalate ($SrBi_2(Nb,Ta)_2O_9$; SBT), and the like.

FIGS. 7A to 7C and FIGS. 8A to 8C are cross-sectional views showing the steps of a conventional method for manufacturing an electronic device, specifically, a conventional method for manufacturing a ferroelectric memory.

As shown in FIG. 7A, a gate electrode 13 is formed on an element formation region of a semiconductor substrate 10, the region surrounded by an element isolation region 11, with a gate insulating film 12 interposed therebetween. An insulating sidewall 14 is then formed on the side surface of the gate electrode 13. An impurity diffusion layer 15 is formed on both sides of the gate electrode 13 in the element formation region. The impurity diffusion layer 15 serves as a source region or a drain region. The gate electrode 13, the impurity diffusion layer 15 and the like form a MOS (metal oxide semiconductor) transistor 16 as a part of a peripheral element group.

As shown in FIG. 7B, a first interlayer insulating film 17 is formed on the semiconductor substrate 10 so as to cover the peripheral element group including the MOS transistor 16 by a CVD (chemical vapor deposition) method using a $SiH_4$ gas-based material. The first interlayer insulating film 17 is formed from a BPSG (boro-phospho silicate glass) film. The first interlayer insulating film 17 is then planarized by a reflow process using heat treatment at 900° C.

As shown in FIG. 7C, an adhesion layer film 18, a lower electrode film 19, a ferroelectric thin film 20, an upper electrode film 21 and a silicon oxide film 22 are sequentially deposited on the first interlayer insulating film 17. The adhesion layer film 18 is formed from a conductive oxide such as TiOx (where $x \geq 0$). The lower electrode film 19 is formed from a conductive metal such as platinum. The ferroelectric thin film 20 is formed from SBT, PZT or the like. The upper electrode film 21 is formed from a conductive metal such as platinum. The silicon oxide film 22 serves as a mask material used to process the films 18 to 21. Thereafter, a resist pattern (not shown) is formed on the silicon oxide film 22. The resist pattern is used to pattern the lower electrode film 19 into predetermined dimensions to form a lower electrode. The films 18 to 22 are then patterned by etching, ion milling or the like. The films 18 to 22 thus patterned include a portion which will later serve as a ferroelectric thin film capacitor (see FIG. 8A) which forms a memory cell. Products by etching reaction (hereinafter, referred to as etching products), a residual resist material and the like produced by the step of FIG. 7C are then removed by, e.g., ashing and scrubber cleaning using ultra-pure water (hereinafter, referred to as ultra-pure water scrubber washing).

FIG. 9 schematically shows an example of the structure of an ultra-pure water scrubber cleaning device.

As shown in FIG. 9, a wafer 51, a substrate to be processed, is placed on a wafer stage 52 provided within a process cup (cleaning cup) 50. The wafer stage 52 is rotated by a motor 53. A nozzle 54 is provided above the wafer 51 within the process cup 50. Ultra-pure water is supplied from the outside of the process cup 50 to the nozzle 54 through an ultra-pure water supply pipe 55. The surface of the wafer 51 is cleaned with ultra-pure water 56 injected from the nozzle 54.

As shown in FIG. 8A, after the resist pattern (not shown) for patterning the upper electrode film 21 into predetermined dimensions to form an upper electrode is formed on the silicon oxide film 22, the silicon oxide film 22, the upper electrode film 21 and the ferroelectric thin film 20 are patterned by etching, ion milling or the like to form a ferroelectric thin film capacitor 23. Etching products, a residual resist material and the like produced by the step of FIG. 8A are then removed by ashing and ultra-pure water scrubber cleaning.

As shown in FIG. 8B, a second interlayer insulating film 24 is formed on the first interlayer insulating film 17 so as to cover the ferroelectric thin film capacitor 23 by a CVD method using an ozone TEOS (tetra ethyl ortho silicate) gas-based material. The second interlayer insulating film 24 is formed from a silicon oxide film. The second interlayer insulating film 24 is then planarized, and a plurality of contact holes 25 reaching the elements such as MOS transistor 16 and ferroelectric thin film capacitor 23 are formed in the first interlayer insulating film 17, the second interlayer insulating film 24 and the silicon oxide film 22. Etching products, a residual resist material and the like produced by the step of FIG. 8B are then removed by ashing and ultra-pure water scrubber cleaning.

As shown in FIG. 8C, extended wirings 26 for the elements such as MOS transistor 16 and ferroelectric thin film capacitor 23 are formed on the second interlayer insulating film 24 including the contact holes 25. A semiconductor integrated circuit having the elements electrically connected to each other is thus formed. Etching products, a residual resist material and the like produced by the step of FIG. 8C are then removed by ashing, cleaning using a polymer removing solution such as organic acid, and final washing using water.

Note that description and illustration of the steps following the step of FIG. 8C (such as the steps of forming an upper layer wiring, forming a protection film, and forming a pad portion) are omitted.

In the above conventional method for manufacturing an electronic device, ultra-pure water scrubber cleaning may be replaced with RCA cleaning or BHF (buffered hydrofluoric acid) cleaning.

It is widely known in the art that practical application of an electronic device having an element including an insulating metal oxide film (such as a ferroelectric memory) is hindered by degradation in characteristics of the element caused by water. The mechanism of such degradation is not known. However, it is dominantly considered that such degradation in characteristics of the element is caused by reduction of an oxide (i.e., a ferroelectric material or a high-k material). More specifically, heat treatment required in the step of forming a wiring and the like causes reaction between water contained in an insulating film and a wiring material such as aluminum and titanium, and hydrogen produced by the reaction reduces an oxide (a ferroelectric material or a high-k material).

In any case, any water molecules remaining in an insulating film or the like would cause reduction in dielectric strength of a ferroelectric thin film or a high dielectric constant thin film, or degradation in polarization characteristics (such as polarization reversal fatigue characteristics) of a ferroelectric material. This makes stable production of electronic devices difficult.

In the above conventional method for manufacturing an electronic device, however, water directly contacts the ferroelectric thin film 20 or the underlying first interlayer insulating film 17 in the cleaning step using a cleaning solution (specifically, ultra-pure water), i.e., the cleaning step conducted after the step of forming a lower electrode (the step of FIG. 7C) and the step of forming an upper electrode (the step of FIG. 8A).

Moreover, if the first interlayer insulating film 17 or the second interlayer insulating film 24 (each of which is formed from a BPSG film formed by a CVD method using a $SiH_4$ gas-based material or a silicon oxide film formed by a CVD method using a ozone TEOS gas-based material) is planarized by a CMP (chemical mechanical polishing) method, water is used in the cleaning step following the planarizing step by a CMP method (post-planarization cleaning step). Therefore, water directly contacts each interlayer insulating film. Moreover, water contacts an exposed region of the surface of each interlayer insulating film in the cleaning step conducted after the step of forming contact holes and the step of forming a wiring.

It is known in the art that a BPSG film formed by a CVD method using a $SiH_4$ gas-based material and a silicon oxide film formed by a CVD method using an ozone TEOS gas-based material, which are used as an interlayer insulating film, is generally likely to adsorb water. Water molecules adsorbed by or remaining in an interlayer insulating film or a ferroelectric film, the interface between various films, or the like can be removed by heat treatment such as high-temperature baking. However, it is impossible to control the thermal diffusion direction of the water molecules. Therefore, although some water molecules are removed to the outside of the device, other water molecules are diffused toward an element such as a ferroelectric capacitor, that is, toward the inside of the device, and thus remain within the device. It is impossible to prevent the latter water molecules from being diffused again by subsequent heat treatment of a metal wiring (such as sintering). Such diffusion of the water molecules would adversely affect ferroelectric characteristics and the like.

The same problems also occur in the case where an electronic device having an element using a high-k material such as BST (e.g., DRAM (Dynamic Random Access Memory)) is manufactured by the above conventional manufacturing method instead of a ferroelectric memory.

SUMMARY OF THE INVENTION

It is an object of the present invention to prevent problems caused by water molecules remaining near an element (such as reduction in dielectric strength of a ferroelectric film or a high-k film, degradation in polarization reversal fatigue characteristics of a ferroelectric material, or the like) in manufacturing of an electronic device having an element including a ferroelectric film or a high-k film.

In order to achieve the above object, in a method for manufacturing an electronic device having an element including an insulating metal oxide film according to a first aspect of the present invention, dry cleaning is used in a cleaning step conducted after a step of forming the insulating metal oxide film.

In the manufacturing method of the first aspect of the present invention, dry cleaning is used in the cleaning step conducted after formation of the insulating metal oxide film which will later serve as a part of the element, specifically, after formation of a ferroelectric film or a high-k film. Since the ferroelectric film or the high-k film or the peripheral region thereof does not directly contact water in the cleaning step, the amount of water molecules remaining near the element can be reduced. As a result, water molecules remaining near the element are less diffused to the ferroelectric film or the high-k film by heat treatment conducted after formation of the element. Therefore, reduction in dielectric strength of the ferroelectric film or the high-k film, degradation in polarization reversal fatigue characteristics of a ferroelectric material, and the like can be prevented. This eliminates variation in characteristics of the element caused by variation in adsorbed water or the like in the manufacturing process. As a result, stable production of an electronic device is assured.

In the manufacturing method of the first aspect, the element may be at least partially exposed in the cleaning step conducted after the step of forming the insulating metal oxide film.

According to a second aspect of the present invention, a method for manufacturing an electronic device having an element including an insulating metal oxide film includes the step of forming an interlayer insulating film so as to cover the element after formation of the element. Dry cleaning is used in a cleaning step conducted after the step of forming the interlayer insulating film.

In the manufacturing method of the second aspect of the present invention, dry cleaning is used in the cleaning step conducted after formation of the interlayer insulating film which covers the element including the insulating metal oxide film, specifically, a ferroelectric film or a high-k film. Since the interlayer insulating film covering the element does not directly contact water in the cleaning step, the amount of water molecules remaining near the element can be reduced. As a result, water molecules remaining near the element are less diffused to the ferroelectric film or the high-k film by heat treatment conducted after formation of the element. Therefore, reduction in dielectric strength of the ferroelectric film or the high-k film, degradation in polarization reversal fatigue characteristics of a ferroelectric material, and the like can be prevented. This eliminates variation in characteristics of the element caused by variation in adsorbed water or the like in the manufacturing process. As a result, stable production of an electronic device is assured.

In the manufacturing method of the second aspect of the present invention, the interlayer insulating film may be at least partially exposed in the cleaning step conducted after the step of forming the interlayer insulating film.

In the manufacturing method of the first or second aspect of the present invention, the dry cleaning is preferably ashing, Ar aerosol cleaning, $CO_2$ cleaning, UV (ultraviolet) cleaning, or cleaning using $CO_2$ in a supercritical state.

This reliably prevents the ferroelectric film or the high-k film or the peripheral region thereof (such as the interlayer insulating film) from directly contacting water.

According to a third aspect of the present invention, in a method for manufacturing an electronic device having an element including an insulating metal oxide film, a cleaning solution containing substantially no water is used in a cleaning step conducted after a step of forming the insulating metal oxide film.

According to the manufacturing method of the third aspect of the present invention, a cleaning solution containing substantially no water is used in the cleaning step conducted after formation of the insulating metal oxide film which will later serve as a part of the element, specifically, after formation of a ferroelectric film or a high-k film. This reduces the amount of water which directly contacts the ferroelectric film or the high-k film or the peripheral region thereof in the cleaning step. Therefore, the amount of water molecules remaining near the element can be reduced. As a result, water molecules remaining near the element are less diffused to the ferroelectric film or the high-k film by heat treatment conducted after formation of the element. Therefore, reduction in dielectric strength of the ferroelectric film or the high-k film, degradation in polarization reversal fatigue characteristics of a ferroelectric material, and the like can be prevented. This eliminates variation in characteristics of the element caused by variation in adsorbed water or the like in the manufacturing process. As a result, stable production of an electronic device is assured.

In the manufacturing method of the third aspect of the present invention, the element may be at least partially exposed in the cleaning step conducted after the step of forming the insulating metal oxide film.

According to a fourth aspect of the present invention, a method for manufacturing an electronic device having an element including an insulating metal oxide film includes the step of forming an interlayer insulating film so as to cover the element after formation of the element. A cleaning solution containing substantially no water is used in a cleaning step conducted after the step of forming the interlayer insulating film.

In the manufacturing method of the fourth aspect of the present invention, a cleaning solution containing substantially no water is used in the cleaning step conducted after formation of the interlayer insulating film which covers the element including the insulating metal oxide film, specifically, the element including a ferroelectric film or a high-k film. This reduces the amount of water which directly contacts the interlayer insulating film covering the element in the cleaning step. Therefore, the amount of water molecules remaining near the element can be reduced. As a result, water molecules remaining near the element are less diffused to the ferroelectric film or the high-k film by heat treatment conducted after formation of the element. Therefore, reduction in dielectric strength of the ferroelectric film or the high-k film, degradation in polarization reversal fatigue characteristics of a ferroelectric material, and the like can be prevented. This eliminates variation in characteristics of the element caused by variation in adsorbed water or the like in the manufacturing process. As a result, stable production of an electronic device is assured.

In the manufacturing method of the fourth aspect of the present invention, the interlayer insulating film may be at least partially exposed in the cleaning step conducted after the step of forming the interlayer insulating film.

In the manufacturing method of the third or fourth aspect of the present invention, the cleaning solution is preferably an organic solvent.

This prevents the ferroelectric film or the high-k film or the peripheral region, thereof (such as the interlayer insulating film) from directly contacting water. Note that, in the manufacturing method of the third or fourth aspect of the present invention, the cleaning solution most desirably contains 0% of water. However, if the cleaning solution contains water as an impurity, or if the cleaning solution contains at most about 5% of water and influences of the water on various characteristics of the ferroelectric film or the high-k film can be ignored from a practical standpoint, the cleaning solution is regarded as containing substantially no water.

According to a fifth aspect of the present invention, in a method for manufacturing an electronic device having an element including an insulating metal oxide film, at least one of organic cleaning using an organic solvent, Ar aerosol cleaning, $CO_2$ cleaning, UV cleaning, and cleaning using $CO_2$ in a supercritical state is used in a cleaning step conducted after a step of forming the insulating metal oxide film, and ashing is not used in the cleaning step.

According to the manufacturing method of the fifth aspect of the present invention, the following effects can be obtained in addition to the effects obtained by the manufacturing method of the first or third aspect of the present invention. Since influences of plasma damage caused by ashing are eliminated, production of an electronic device having more stable characteristics is assured.

In the manufacturing method of the fifth aspect of the present invention, the element may be at least partially exposed in the cleaning step conducted after the step of forming the insulating metal oxide film.

According to a sixth aspect of the present invention, a method for manufacturing an electronic device having an element including an insulating metal oxide film includes the step of forming an interlayer insulating film so as to cover the element after formation of the element. At least one of organic cleaning using an organic solvent, Ar aerosol cleaning, $CO_2$ cleaning, UV cleaning, and cleaning using $CO_2$ in a supercritical state is used in a cleaning step conducted after the step of forming the interlayer insulating film, and ashing is not used in the cleaning step.

According to the manufacturing method of the sixth aspect of the present invention, the following effects can be obtained in addition to the effects obtained by the manufacturing method of the second or fourth aspect of the present invention. Since influences of plasma damage caused by ashing are eliminated, production of an electronic device having more stable characteristics is assured.

In the manufacturing method of the sixth aspect of the present invention, the interlayer insulating film may be at least partially exposed in the cleaning step conducted after the step of forming the interlayer insulating film.

BRIEF DESCRIPTION OF THE DRAWINGS

FIG. 3 schematically show an example of the structure of a $CO_2$ cleaning device used in the method for manufacturing an electronic device according to the first embodiment of the present invention;

DESCRIPTION OF THE PREFERRED EMBODIMENTS (First Embodiment)

Hereinafter, a method for manufacturing an electronic device according to the first embodiment of the present invention will be described with reference to the figures. It is herein assumed that a ferroelectric memory is manufactured.

FIGS. 1A to 1C and FIGS. 2A to 2C are cross-sectional views showing the steps of a method for manufacturing an electronic device according to the first embodiment.

Figure 1A:
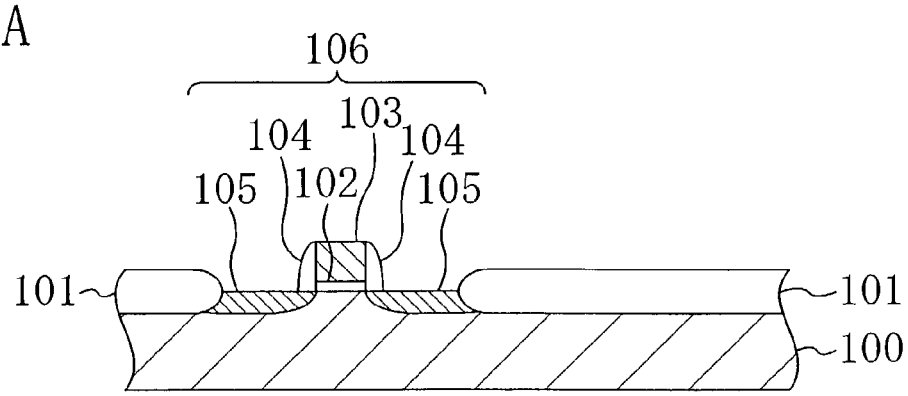
FIGS. 1A, 1B and 1C are cross-sectional views showing the steps of a method for manufacturing an electronic device according to a first embodiment of the present invention.

As shown in FIG. 1A, a gate electrode 103 is formed on an element formation region of a semiconductor substrate 100, the region surrounded by an element isolation region 101, with a gate insulating film 102 interposed therebetween. An insulating sidewall 104 is then formed on the side surface of the gate electrode 103. An impurity diffusion layer 105 is formed on both sides of the gate electrode 103 in the element formation region. The impurity diffusion layer 105 serves as a source region or a drain region. The gate electrode 103, the impurity diffusion layer 105 and the like form a MOS transistor 106 as a part of a peripheral element group.

Figure 1B:
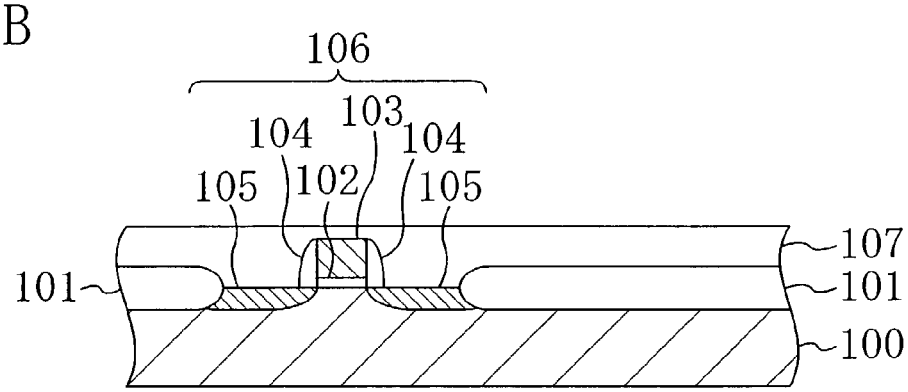

As shown in FIG. 1B, a first interlayer insulating film 107 is formed on the semiconductor substrate 100 so as to cover the peripheral element group including the MOS transistor 106 by a CVD method using a $SiH_4$ gas-based material. The first interlayer insulating film 107 is formed from a BPSG film. The first interlayer insulating film 107 is then planarized by a reflow process using heat treatment at, e.g., about 900° C.

Figure 1C:
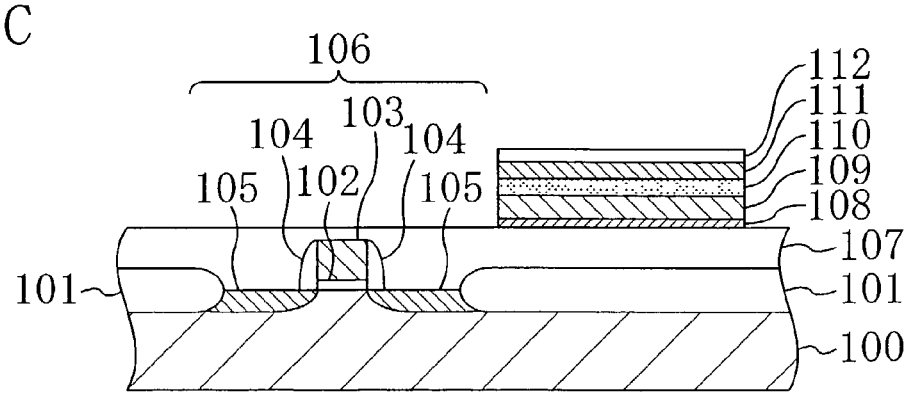

As shown in FIG. 1C, an adhesion layer film 108, a lower electrode film 109, a ferroelectric thin film 110, an upper electrode film 111 and a silicon oxide film 112 are sequentially deposited on the first interlayer insulating film 107. The adhesion layer film 108 is formed from a conductive oxide such as TiOx (where $x \geq 0$). The lower electrode film 109 is formed from a conductive metal such as platinum.

The ferroelectric thin film 110 is formed from SBT, PZT or the like. The upper electrode film 111 is formed from a conductive metal such as platinum. The silicon oxide film 112 serves as a mask material used to process the films 108 to 111. Thereafter, a resist pattern (not shown) is formed on the silicon oxide film 112. The resist pattern is used to pattern the lower electrode film 109 into predetermined dimensions to form a lower electrode. The films 108 to 112 are then patterned by etching, ion milling or the like. The films 108 to 112 thus patterned include a portion which will later serve as a ferroelectric thin film capacitor (see FIG. 2A) which forms a memory cell. Etching products, a residual resist material and the like produced by the step of FIG. 1C are then removed by dry cleaning. For example, etching products, a residual resist material and the like are removed by $CO_2$ cleaning (a method for cleaning the substrate surface by injecting solid carbon dioxide particles) and UV cleaning (a method for cleaning the substrate surface with active atoms or molecules (active species) produced by radiating ultraviolet (UV) rays to a prescribed gas). Ashing may be conducted before $CO_2$ cleaning and UV cleaning. Alternatively, only one of $CO_2$ cleaning and UV cleaning may be used.

FIG. 3 schematically shows an example of the structure of a $CO_2$ cleaning device.

As shown in FIG. 3, a wafer 201, a substrate to be processed, is placed on a wafer stage 202 provided within a processing chamber 200. The processing chamber 200 is purged in advance with, e.g., nitrogen ($N_2$) (water is removed by an $N_2$ atmosphere). The wafer stage 202 is fixed within the processing chamber 200 by a support 203. A scan nozzle 204 for injecting, e.g., solid $CO_2$ (dry ice) particles having a purity of 99.99% or more is placed above the wafer 201 within the processing chamber 200. For example, the effective injection diameter and effective injection pressure of the scan nozzle 204 are 8 mm and 5 MPa. The scan nozzle 204 scans the wafer 201 while keeping the distance to the wafer 201 and the injection angle of the dry ice particles to the wafer 201 at, e.g., 15 mm and 45°, respectively. The dry ice particles are supplied from a dry ice particle supply source provided outside the processing chamber 200 to the scan nozzle 204 through a dry ice particle supply pipe 205. The surface of the wafer 201 is cleaned with the dry ice particles 206 injected from the scan nozzle 204. Note that the scan nozzle 204 may be replaced with a fixed nozzle. In this case, the wafer stage 202 is replaced with a wafer stage capable of moving two-dimensionally (x-y movable stage).

Figure 4:
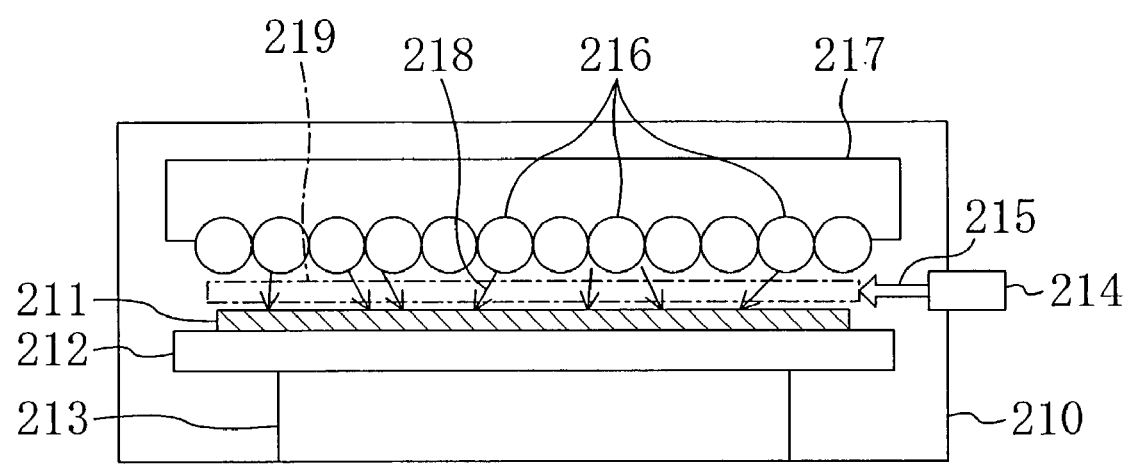
FIG. 4 schematically shows an example of the structure of a UV (ultraviolet) cleaning device used in the method for manufacturing an electronic device according to the first embodiment of the present invention.

FIG. 4 schematically shows an example of the structure of a UV cleaning device.

As shown in FIG. 4, a wafer 211, a substrate to be processed, is placed on a wafer stage 212 provided within a processing chamber 210. The wafer stage 212 is fixed within the processing chamber 210 by a support 213. A gas supply port 214 is formed in the side of the processing chamber 210. An oxygen gas 215 is introduced from the gas supply port 214 into the processing chamber 210. A plurality of UV radiation lamps (e.g., excimer lamps having a central wavelength of 172 nm) 216 are arranged over the wafer 211 in the processing chamber 210. Each UV radiation lamp 216 is attached to a holding mechanism 217. For example, the UV radiation lamps 216 radiate UV rays 218 to the oxygen gas 215 within the processing chamber 210 at 5 $mW/cm^2$ for 60 seconds. As a result, active species 219 such as ozone and excited oxygen atoms are produced by the energy of the UV rays 218. The active species 219 disconnect molecular bonds of organic matters and the like which are present on the wafer 211, whereby the organic matters and the like are scattered as an oxide gas and removed. As a result, the surface of the wafer 211 is cleaned. Note that another gas such as air or ozone may be used instead of the oxygen gas 215. In other words, active species may be produced by radiating UV rays 218 to another gas, and the surface of the wafer 211 may be cleaned with the active species thus produced.

Figure 2A:
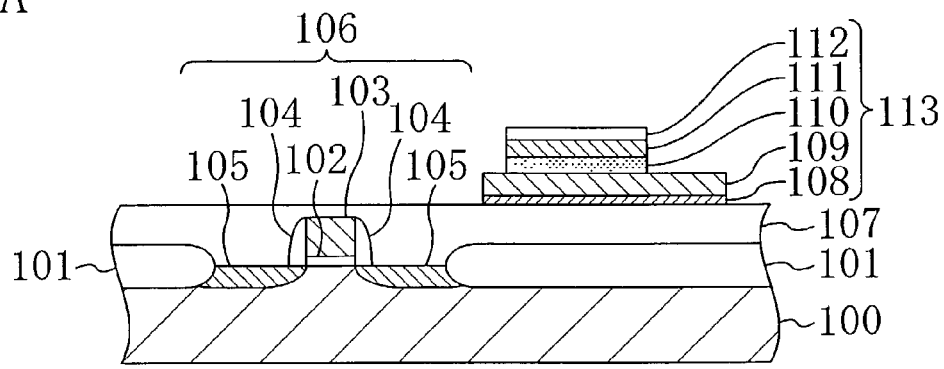
FIGS. 2A, 2B and 2C are cross-sectional views showing the steps of the method for manufacturing an electronic device according to the first embodiment of the present invention.

As shown in FIG. 2A, a resist pattern (not shown) is then formed on the silicon oxide film 112. The resist pattern is used to pattern the upper electrode film 111 into predetermined dimensions to form an upper electrode. Thereafter, the silicon oxide film 112, the upper electrode film 111 and the ferroelectric thin film 110 are patterned by etching, ion milling or the like to form a ferroelectric thin film capacitor 113. Etching products, a residual resist material and the like produced by the step of FIG. 2A are then removed by wet cleaning using a cleaning solution containing substantially no water, e.g., organic cleaning. More specifically, organic cleaning is conducted at about 75° C. for five minutes using an amine-based solution containing substantially no water as an organic solvent, and IPA (isopropyl alcohol) drying is conducted.

Figure 2B:
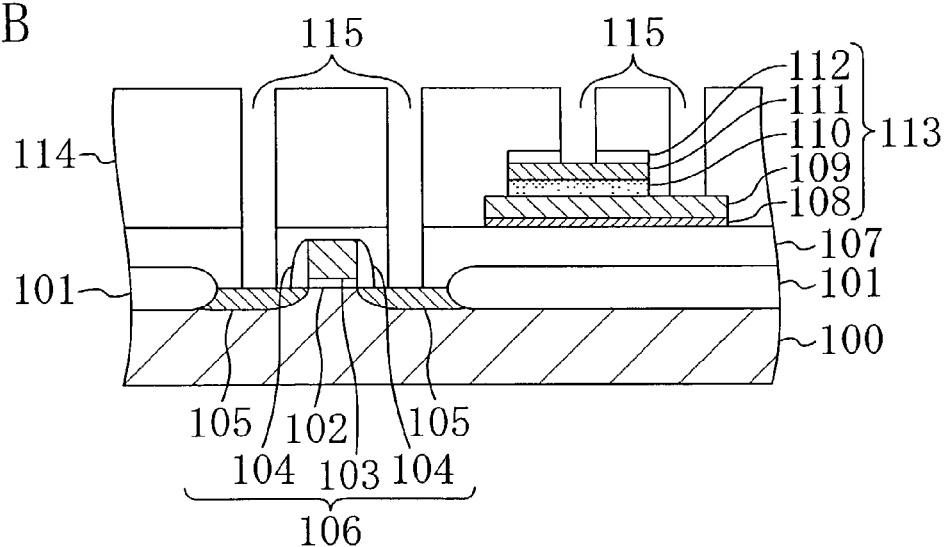

As shown in FIG. 2B, a second interlayer insulating film 114 is formed on the first interlayer insulating film 107 so as to cover the ferroelectric thin film capacitor 113 by, e.g., a CVD method using an ozone TEOS gas-based material. The second interlayer insulating film 114 is formed from a silicon oxide film. The second interlayer insulating film 114 is then planarized, and a plurality of contact holes 115 reaching the elements such as MOS transistor 106 and ferroelectric thin film capacitor 113 are formed in the first interlayer insulating film 107, the second interlayer insulating film 114 and the silicon oxide film 112. Etching products, a residual resist material and the like produced by the step of FIG. 2B are then removed by dry cleaning (e.g., ashing and Ar aerosol cleaning (a method for cleaning the substrate surface by injecting argon aerosol (a mixture of fine solid argon, liquid argon and argon gas)). Ashing refers to a commonly used dry process for removing a photoresist by ashing with, e.g., $O_2$ plasma.

Figure 5:
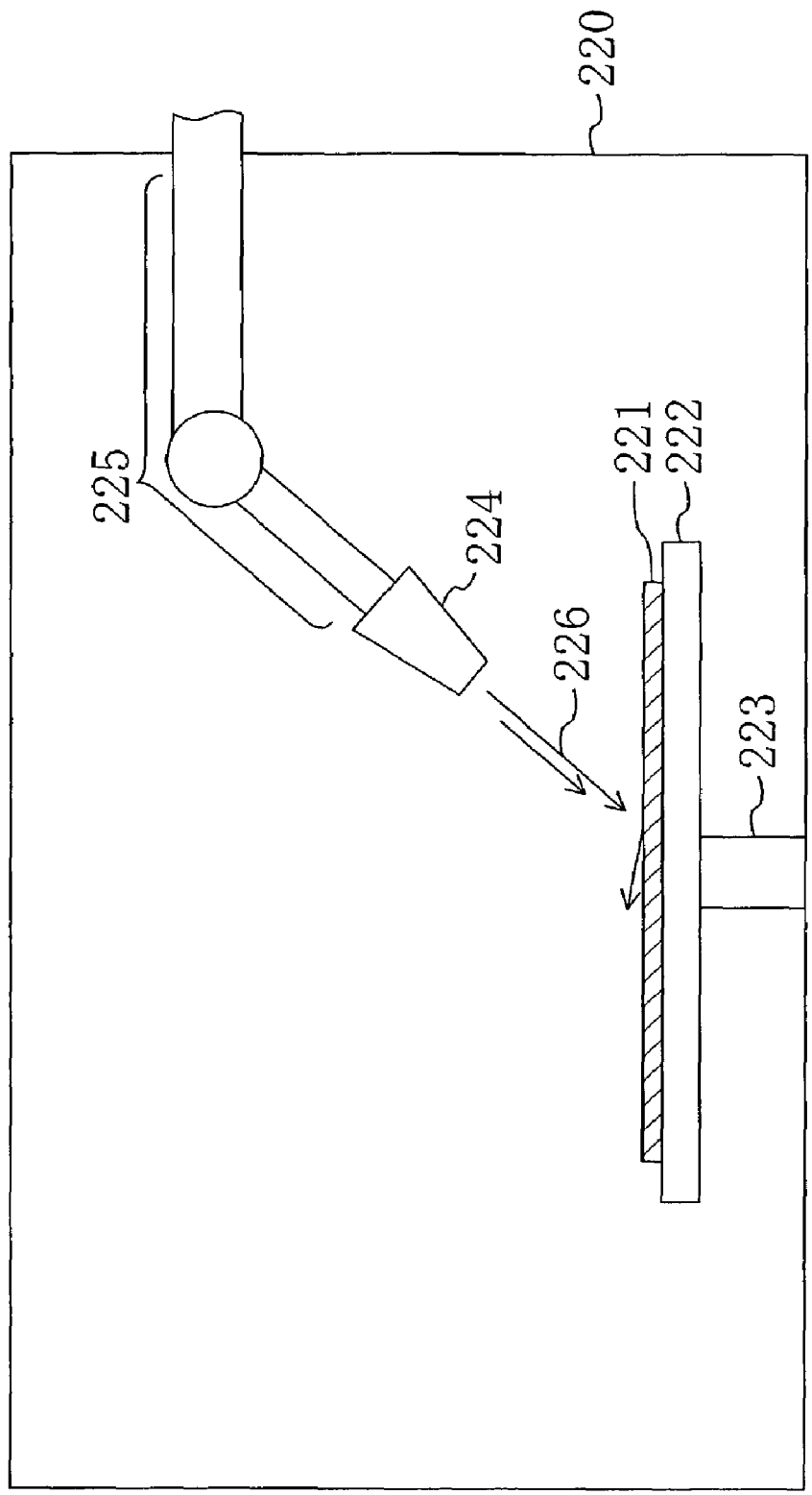
FIG. 5 schematically shows an example of the structure of an Ar aerosol cleaning device used in the method for manufacturing an electronic device according to the first embodiment of the present invention.

FIG. 5 schematically shows an example of the structure of an Ar aerosol cleaning device.

As shown in FIG. 5, a wafer 221, a substrate to be processed, is placed on a wafer stage 222 provided within a chamber 220. A support 223 for holding the wafer stage 222 is capable of moving the wafer stage 222 two-dimensionally In other words, the wafer stage 222 is an x-y movable stage. A nozzle 224 for injecting Ar aerosol is provided above the wafer 221 in the chamber 220. Ar aerosol is supplied from an Ar aerosol supply source provided outside the chamber 220 to the nozzle 224 through an Ar aerosol supply pipe 225. For example, the surface of the wafer 221 is cleaned by injecting Ar aerosol 226 from the nozzle 224 to the wafer 221 at about 100 liters/min and moving the wafer stage 222 two-dimensionally for scanning, while keeping the pressure within the chamber 220 at about 5 kPa. Note that a vacuum chamber or a reduced-pressure chamber may be used as the chamber 220. The wafer stage 222 (x-y movable stage) may be replaced with a fixed wafer stage. In this case, the fixed nozzle 224 is replaced with a scan nozzle capable of moving over the wafer 221 two-dimensionally. Although Ar aerosol is herein injected from the nozzle 224, a mixed gas of Ar aerosol, nitrogen gas or the like may be injected from the nozzle 224. Alternatively, a nitrogen gas may be injected from another nozzle in order to accelerate Ar aerosol injected from the nozzle 224.

Figure 2C:
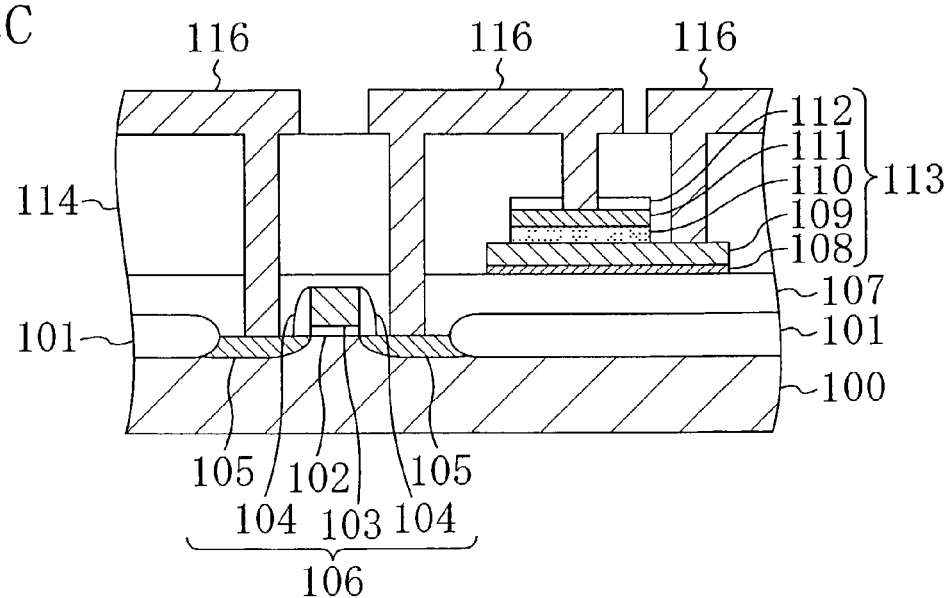

As shown in FIG. 2C, extended wirings 116 for the elements such as MOS transistor 106 and ferroelectric thin film capacitor 113 are formed on the second interlayer insulating film 114 including the contact holes 115. A semiconductor integrated circuit having the elements electrically connected to each other is thus formed. Etching products, a residual resist material and the like produced by the step of FIG. 2C are then removed by dry cleaning (e.g., ashing and Ar aerosol cleaning).

Note that description and illustration of the steps following the step of FIG. 2C (such as the steps of forming an upper layer wiring, forming a protection film, and forming a pad portion) are omitted.

As has been described above, according to the first embodiment, dry cleaning (such as $CO_2$ cleaning or UV cleaning) is used in the cleaning step following the step of forming the ferroelectric thin film 110 which will later serve as a part of the ferroelectric thin film capacitor 113 (specifically, the cleaning step for removing etching products and the like produced by the step of FIG. 1C). Therefore, the ferroelectric thin film 110 or the peripheral region thereof does not directly contact water in this cleaning step. Moreover, wet cleaning using a cleaning solution containing substantially no water (such as organic cleaning) is used in the cleaning step following the step of forming the ferroelectric thin film capacitor 113 including the ferroelectric thin film 110 (specifically, the cleaning step for removing etching products and the like produced by the step of FIG. 2A). This reduces the amount of water which directly contacts the ferroelectric thin film capacitor 113 or the peripheral region thereof in this cleaning step. Moreover, dry cleaning (such as ashing or Ar aerosol cleaning) is used in the cleaning step following the step of forming the second interlayer insulating film 114 covering the ferroelectric thin film capacitor 113 (specifically, the cleaning step for removing etching products and the like produced by the step of FIG. 2B or 2C). Therefore, the second interlayer insulating film 114 does not directly contact water in this cleaning step.

In other words, the first embodiment enables significant reduction in the amount of water molecules remaining near the ferroelectric thin film capacitor 113. As a result, water molecules remaining near the ferroelectric thin film capacitor 113 are less diffused to the ferroelectric thin film 110 by heat treatment (e.g., dehydration baking or sintering of wirings) conducted after the step of forming the ferroelectric thin film capacitor 113. Therefore, reduction in dielectric strength of the ferroelectric thin film 110, degradation in polarization reversal fatigue characteristics of the ferroelectric material, and the like can be prevented. This eliminates variation in characteristics of the ferroelectric thin film capacitor 113 caused by variation in adsorbed water or the like in the manufacturing process. As a result, stable production of an electronic device is assured.

Hereinafter, the method for manufacturing an electronic device according to the first embodiment (hereinafter, referred to as the present embodiment) is compared with the conventional method for manufacturing an electronic device (hereinafter, referred to as the conventional example) in terms of polarization characteristics of the ferroelectric thin film 110 with reference to FIG. 6.

Figure 6:
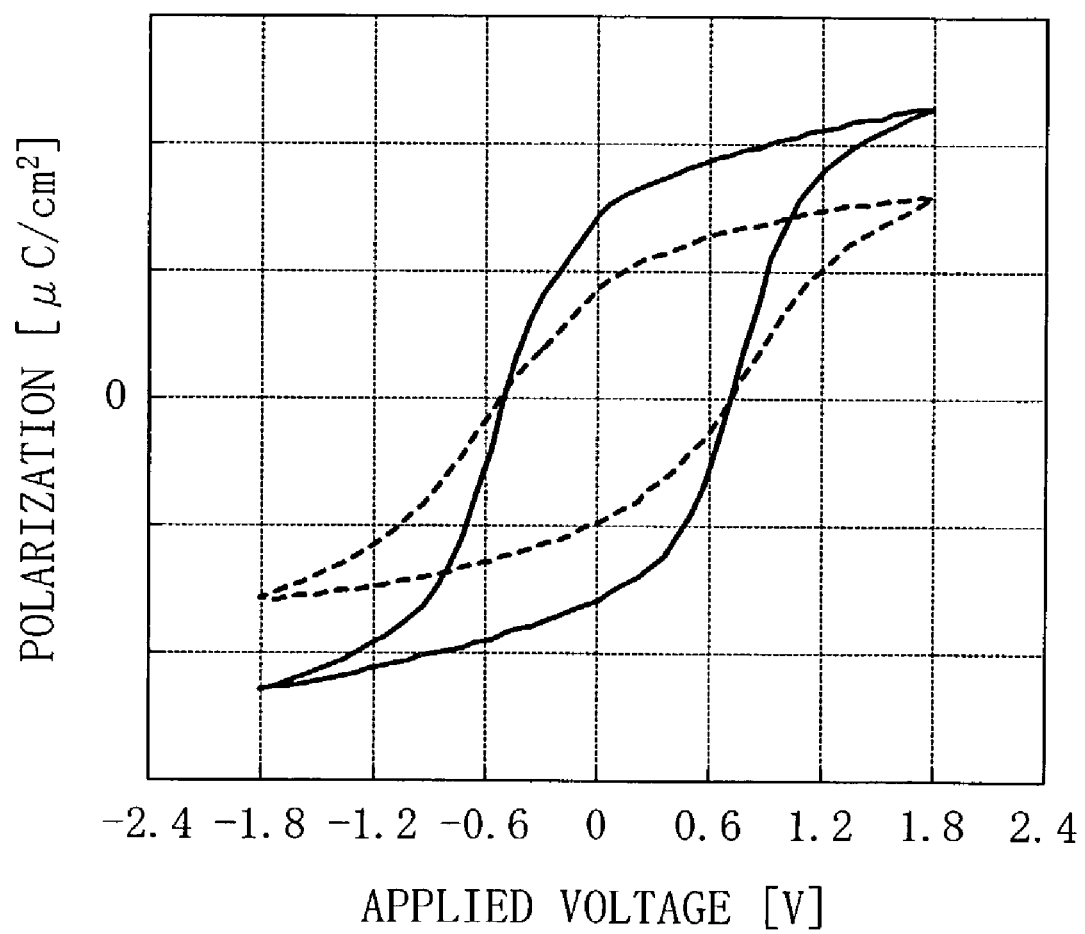
FIG. 6 shows the comparison result of polarization characteristics of a ferroelectric film between the method for manufacturing an electronic device according to the first embodiment of the present invention and a conventional method for manufacturing an electronic device.
Figure 7A:
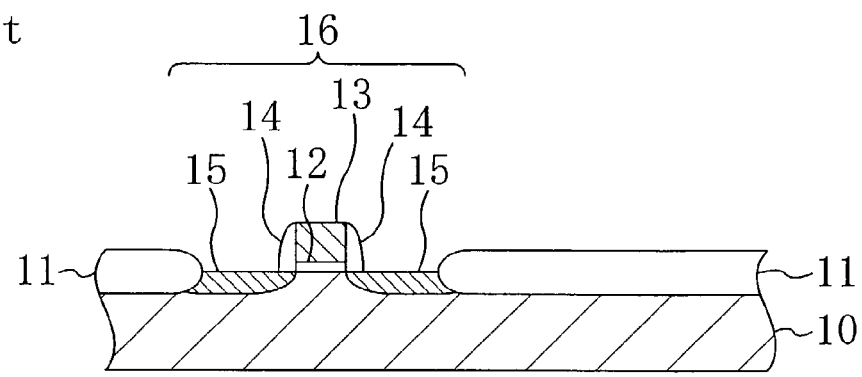
FIGS. 7A, 7B and 7C are cross-sectional views showing the steps of a conventional method for manufacturing an electronic device.
Figure 7B:
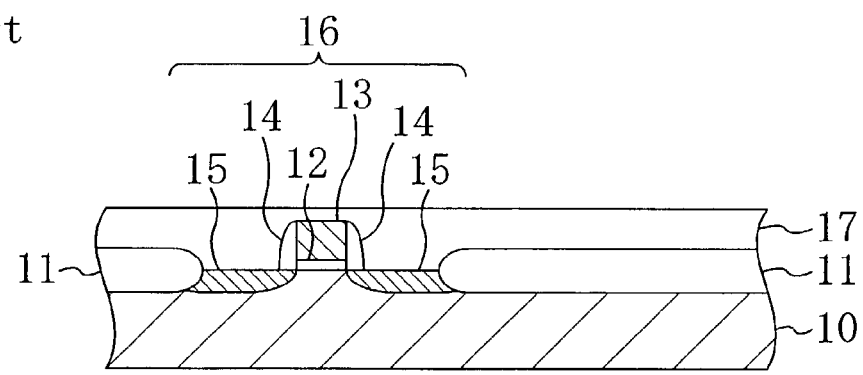
Figure 7C:
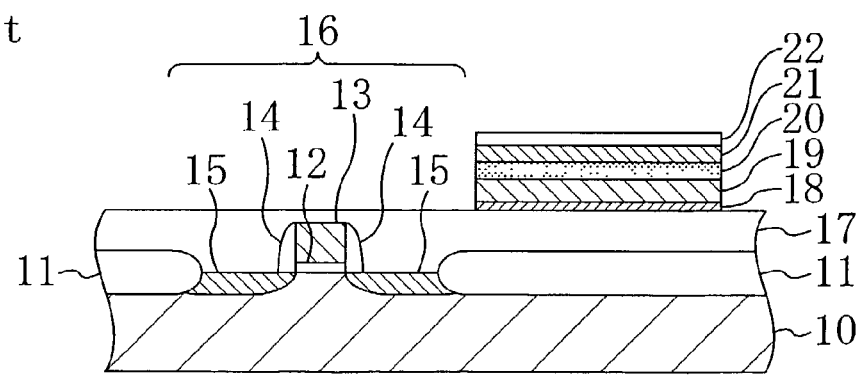
Figure 8A:
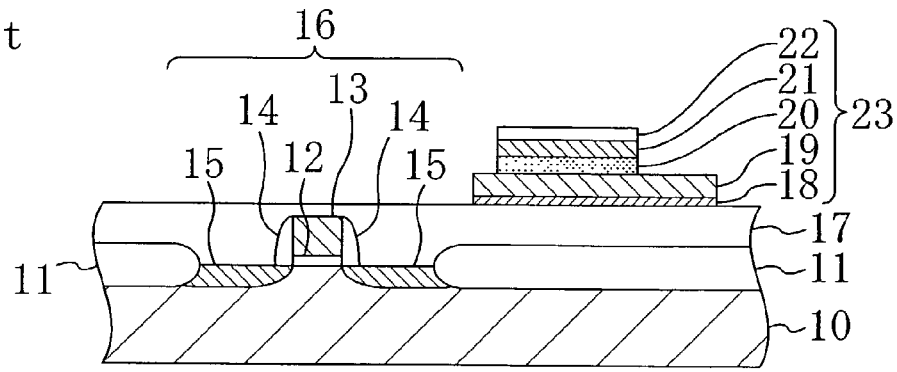
FIGS. 8A, 8B and 8C are cross-sectional views showing the steps of the conventional method for manufacturing an electronic device.
Figure 8B:
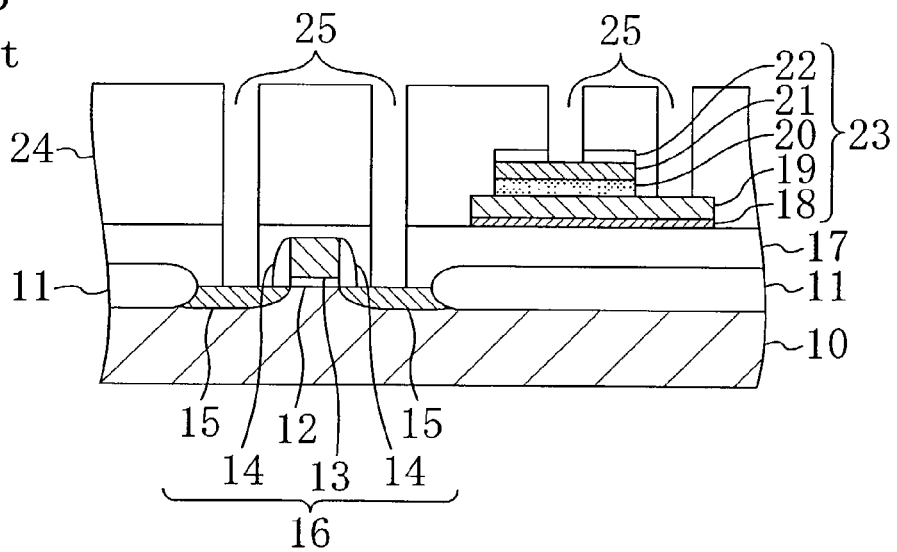
Figure 8C:
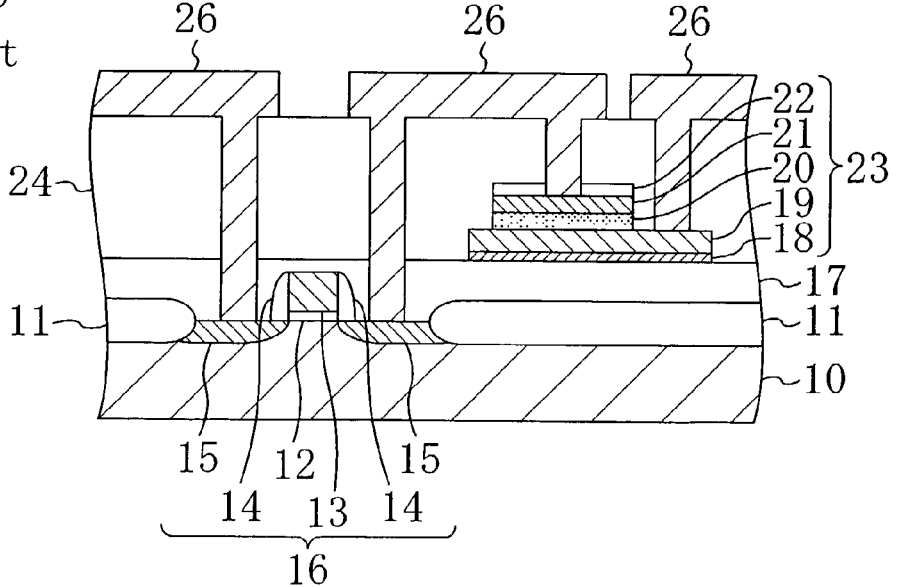
Figure 9:
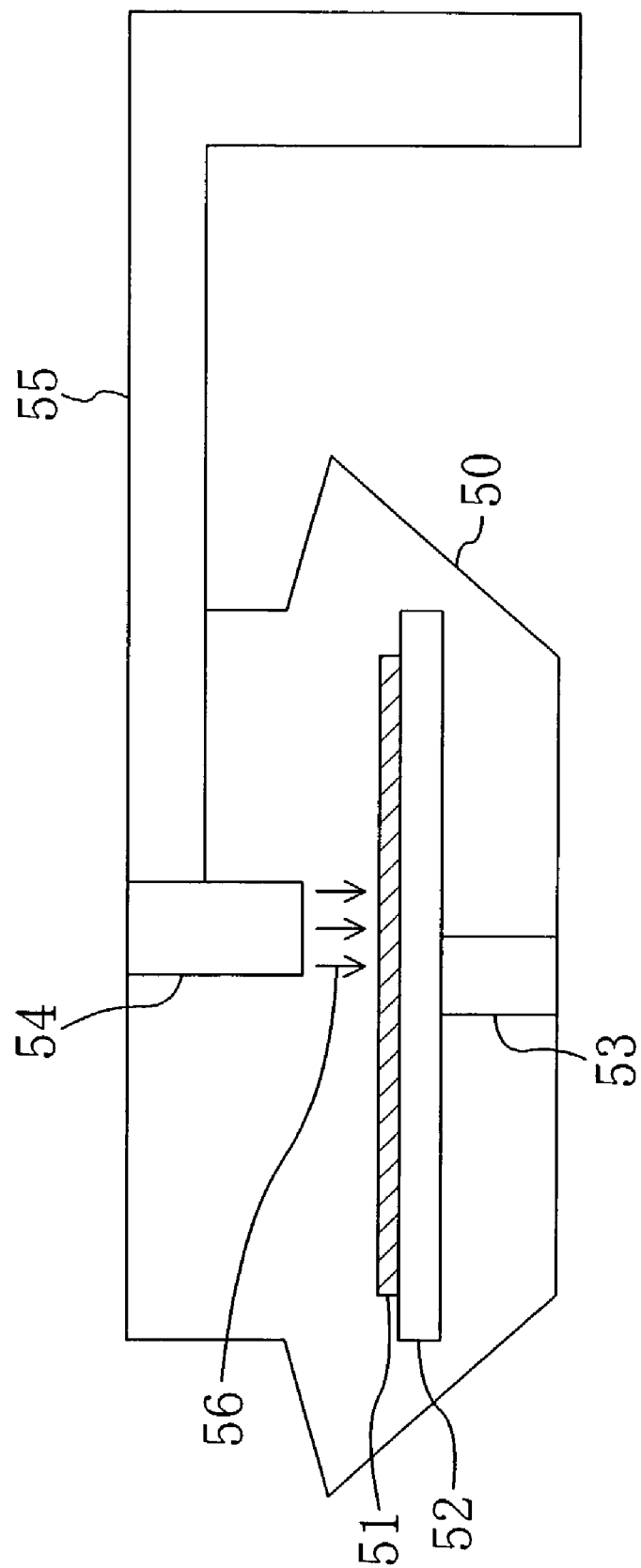
FIG. 9 schematically shows an example of the structure of an ultra-pure water scrubber cleaning device used in the conventional method for manufacturing an electronic device.

In FIG. 6, solid line indicates polarization characteristics obtained by the present embodiment, and dashed line indicates polarization characteristics obtained by the conventional example. The ordinate indicates a polarization on an arbitrary scale.

For comparison, each component of the samples manufactured by the present embodiment and the conventional example has the same structure in terms of finished dimensions, film thickness, shape and the like. Moreover, the manufacturing process of the present embodiment is the same as that of the conventional example except the steps according to the present invention (specifically, the cleaning steps).

The samples manufactured by the present embodiment and the conventional example were examined with a probe by applying various voltages between the upper electrode and the lower electrode of the ferroelectric capacitor in the samples. The resultant hysteresis curves are shown in FIG. 6. In other words, FIG. 6 shows hysteresis curves of a polarization of the ferroelectric capacitor with respect to an applied voltage in the samples manufactured by the present embodiment and the conventional example.

As shown in FIG. 6, the hysteresis curve of the conventional example is narrower in the vertical direction than that of the present embodiment. This indicates that polarizability of the conventional example is smaller than that of the present embodiment. In other words, the present embodiment has improved hysteresis characteristics over the conventional example.

Note that, in the first embodiment, an electronic device to be manufactured is not specifically limited as long as the electronic device has an element including an insulating metal oxide film. For example, the above effects are obtained when a non-volatile semiconductor memory such as ferroelectric memory or a high capacity DRAM using a high-k material is manufactured. The insulating metal oxide film herein refers to a film formed from a dielectric material having a ferroelectric property or a high dielectric constant (e.g., a film formed from a ferroelectric material having a perovskite crystal structure). Examples of the dielectric material having a ferroelectric property or a high dielectric constant are PZT, BST and SBT. A film formed from any of these dielectric materials can be formed by, e.g., a MOCVD (metal organic chemical vapor deposition) method, a sol-gel method, a sputtering method or the like.

In the first embodiment, dry cleaning used in the cleaning step for removing etching products and the like produced by the step of FIG. 1C, 2B or 2C is not specifically limited. For example, ashing, $CO_2$ cleaning, UV cleaning, Ar aerosol cleaning, cleaning using $CO_2$ in a supercritical state, cleaning using a gas containing substantially no water, or the like may be used alone or in combination. In each cleaning step, dry cleaning may be replaced with wet cleaning using a cleaning solution containing substantially no water (such as organic cleaning).

In the first embodiment, wet cleaning using a cleaning solution containing substantially no water (specifically, organic cleaning) is used in the cleaning step for removing etching products and the like produced by the step of FIG. 2A. However, dry cleaning may alternatively be used. Note that, in the first embodiment, a cleaning method of organic cleaning is not specifically limited. Examples of the cleaning method of organic cleaning include an immersion cleaning method (a cleaning method in which a cassette loaded with wafers to be processed is immersed in a cleaning bath filled with a cleaning solution), a spray cleaning method (a cleaning method in which a cleaning solution is sprayed to a wafer to be processed; the cleaning solution may be sprayed from the direction of the central axis of rotation while rotating the wafer by a rotor, or ultrasonic waves may be applied to the cleaning solution), and a spin cleaning method (a cleaning method in which a cleaning solution is supplied from a nozzle to a horizontally held wafer to be processed while rotating the wafer; a typical example of a single-wafer processing cleaning method). In the first embodiment, an organic solvent used in organic cleaning is not specifically limited as long as it contains substantially no water. For example, an acetyl acetone solution, a solution of alkyleneglycol monoalkyl ether, a fluorinated alcohol-based solution, an amine-based solution, or a Freon-based solution may be used.

In the first embodiment, dry cleaning or wet cleaning using a cleaning solution containing substantially no water may be used in all cleaning steps conducted after the step of forming the ferroelectric thin film 110. Alternatively, of the cleaning steps conducted after the step of forming the ferroelectric thin film 110, wet cleaning using a water-containing cleaning solution may be used in the cleaning step which does not affect characteristics of the ferroelectric thin film 110.

(Second Embodiment)

Hereinafter, a method for manufacturing an electronic device according to the second embodiment of the present invention will be described with reference to the figures.

The second embodiment is different from the first embodiment in that the method of the second embodiment includes the step of planarizing the second interlayer insulating film 114 by a CMP method after the second interlayer insulating film 114 covering the ferroelectric thin film capacitor 113 is formed in the step of FIG. 2B.

If the second interlayer insulating film 114, that is, the silicon oxide film formed by a CVD method using an ozone TEOS gas-based material, is planarized by a CMP method, the cleaning step for removing slurry after the CMP method is normally conducted using a water-containing cleaning solution. In the second embodiment, however, dry cleaning (e.g., $CO_2$ cleaning using the cleaning device of FIG. 3 (see the first embodiment)) is conducted in this cleaning step. More specifically, as shown in FIG. 3, the scan nozzle 204 having an effective injection diameter of 8 mm scans the wafer 201, a substrate to be processed, while keeping the distance to the wafer 201 and the injection angle of dry ice particles to the wafer 201 at, e.g., 15 mm and 45°, respectively. At the same time, the dry ice particles 206 are injected from the scan nozzle 204 to the wafer 201 at 5 MPa. The surface of the wafer 201 is thus cleaned.

According to the second embodiment, dry cleaning is used in the cleaning step conducted after formation of the second interlayer insulating film 114 covering the ferroelectric thin film capacitor 113 including the ferroelectric thin film 110 (specifically, the cleaning step for removing slurry and the like produced by planarizing the second interlayer insulating film 114 by a CMP method). Since the second interlayer insulating film 114 does not directly contact water in the cleaning step, the amount of water molecules remaining near the ferroelectric thin film capacitor 113 can be significantly reduced. As a result, water molecules remaining near the ferroelectric thin film capacitor 113 are less diffused to the ferroelectric thin film 110 by heat treatment (e.g., dehydration baking or sintering of wirings) conducted after the step of forming the ferroelectric thin film capacitor 113. Therefore, reduction in dielectric strength of the ferroelectric thin film 110, degradation in polarization reversal fatigue characteristics of a ferroelectric material, and the like can be prevented. This eliminates variation in characteristics of the ferroelectric thin film capacitor 113 caused by variation in adsorbed water or the like in the manufacturing process. As a result, stable production of an electronic device is assured.

Note that, in the second embodiment, dry cleaning used in the cleaning step for removing slurry and the like produced by planarizing the second interlayer insulating film 114 by a CMP method is not specifically limited. For example, ashing, $CO_2$ cleaning, UV cleaning, Ar aerosol cleaning, cleaning using $CO_2$ in a supercritical state, cleaning using a gas containing substantially no water, or the like may be used alone or in combination. In this cleaning step, dry cleaning may be replaced with wet cleaning using a cleaning solution containing substantially no water (such as organic cleaning).

(Third Embodiment)

Hereinafter, a method for manufacturing an electronic device according to the third embodiment of the present invention will be described with reference to the figures.

The third embodiment is different from the first embodiment in the following points:

In the first embodiment, ashing and Ar aerosol cleaning are used in the cleaning step for removing etching products and the like produced by the steps of FIGS. 2B and 2C. In the third embodiment, however, this cleaning step is conducted without using ashing. This cleaning step is conducted using at least one of organic cleaning using an organic solvent, Ar aerosol cleaning, $CO_2$ cleaning, UV cleaning, cleaning using $CO_2$ in a supercritical state, and cleaning using a gas containing substantially no water. If organic cleaning using an organic solvent, Ar aerosol cleaning, $CO_2$ cleaning or UV cleaning is used, the cleaning step may be conducted under the same conditions as those of the first or second embodiment.

According to the third embodiment, the following effects can be obtained in addition to the effects of the first embodiment. Since influences of plasma damage caused by ashing are eliminated, production of an electronic device having more stable characteristics is assured.

Note that, in the third embodiment, the cleaning step conducted after formation of the ferroelectric thin film 110 which will later serve as a part of the ferroelectric thin film capacitor 113 (specifically, the cleaning step for removing etching products and the like produced by the step of FIG. 1C or 2A) may be conducted without using ashing. In other words, at least one of organic cleaning using an organic solvent, Ar aerosol cleaning, $CO_2$ cleaning, UV cleaning, cleaning using $CO_2$ in a supercritical state, and cleaning using a gas containing substantially no water may be used in this cleaning step. In this case as well, the above effects specific to the present embodiment can be obtained.

What is claimed is:

1. A method for manufacturing an electronic device having an element including an insulating metal oxide film serving as a ferroelectric film or a high dielectric constant film,
   wherein in a cleaning step conducted after a step of forming the insulating metal oxide film, dry cleaning is used such that the ferroelectric film or the high dielectric constant film or a periphery region thereof does not directly contact water, and
   after the cleaning step, heat treatment is conducted at a temperature at which water remaining near the element is diffused to the ferroelectric film or the high dielectric constant film.

2. A method for manufacturing an electronic device having an element including an insulating metal oxide film serving as a ferroelectric film or a high dielectric constant film, comprising the step of:
   forming an interlayer insulating film so as to cover the element after formation of the element,
   wherein in a cleaning step conducted after a step of forming the interlayer insulating film, dry cleaning is used such that the ferroelectric film or the high dielectric constant film or a periphery region thereof does not directly contact water, and
   after the cleaning step, heat treatment is conducted at a temperature at which water remaining near the element is diffused to the ferroelectric film or the high dielectric constant film.

3. A method for manufacturing an electronic device having an element including an insulating metal oxide film serving as a ferroelectric film or a high dielectric constant film,
   wherein in a cleaning step conducted after a step of forming the insulating metal oxide film, a cleaning solution containing substantially no water is used such that the ferroelectric film or the high dielectric constant film or a periphery region thereof does not directly contact water, and
   after the cleaning step, heat treatment is conducted at a temperature at which water remaining near the element is diffused to the ferroelectric film or the high dielectric constant film.

4. A method for manufacturing an electronic device having an element including an insulating metal oxide film serving as a ferroelectric film or a high dielectric constant film, comprising the step of:
   forming an interlayer insulating film so as to cover the element after formation of the element,
   wherein in a cleaning step conducted after a step of forming the interlayer insulating film, a cleaning solution containing substantially no water is used such that the ferroelectric film or the high dielectric constant film or a periphery region thereof does not directly contact water, and
   after the cleaning step, heat treatment is conducted at a temperature at which water remaining near the element is diffused to the ferroelectric film or the high dielectric constant film.

5. A method for manufacturing an electronic device having an element including an insulating metal oxide film serving as a ferroelectric film or a high dielectric constant film,
   wherein in a cleaning step conducted after a step of forming the insulating metal oxide film, at least one selected from the group consisting of organic cleaning using an organic solvent, Ar aerosol cleaning, $CO_2$ cleaning, UV cleaning, and cleaning using $CO_2$ in a supercritical state is used such that the ferroelectric film, the high dielectric constant film or a periphery region thereof does not directly contact water,
   ashing is not used in the cleaning step, and
   after the cleaning step, heat treatment is conducted at a temperature at which water remaining near the element is diffused to the ferroelectric film or the high dielectric constant film.

6. A method for manufacturing an electronic device having an element including an insulating metal oxide film serving as a ferroelectric film or a high dielectric constant film, comprising the step of:
   forming an interlayer insulating film so as to cover the element after formation of the element,
   wherein in a cleaning step conducted after a step of forming the interlayer insulating film, at least one selected from the group consisting of organic cleaning using an organic solvent, Ar aerosol cleaning, $CO_2$ cleaning, UV cleaning, and cleaning using $CO_2$ in a supercritical state is used such that the ferroelectric film or the high dielectric constant film or a periphery region thereof does not directly contact water, ashing is not used in the cleaning step, and after the cleaning step, heat treatment is conducted at a temperature at which water remaining near the element is diffused to the ferroelectric film or the high dielectric constant film.

7. The method according to claim 1, wherein the element is at least partially exposed in the cleaning step.

8. The method according to claim 1, wherein the dry cleaning is Ar aerosol cleaning, $CO_2$ cleaning, UV cleaning, or cleaning using $CO_2$ in a supercritical state.

9. The method according to claim 2, wherein the interlayer insulating film is at least partially exposed in the cleaning step.

10. The method according to claim 2, wherein the dry cleaning is Ar aerosol cleaning, $CO_2$ cleaning, UV cleaning, or cleaning using $CO_2$ in a supercritical state.

11. The method according to claim 3, wherein the element is at least partially exposed in the cleaning step.

12. The method according to claim 3, wherein the cleaning solution is an organic solvent.

13. The method according to claim 4, wherein the interlayer insulating film is at least partially exposed in the cleaning step.

14. The method according to claim 4, wherein the cleaning solution is an organic solvent.

15. The method according to claim 5, wherein the element is at least partially exposed in the cleaning step.

16. The method according to claim 5, wherein the interlayer insulating film is at least partially exposed in the cleaning step.

* * * * *